United States Patent
Kim

(10) Patent No.: US 6,458,638 B2
(45) Date of Patent: Oct. 1, 2002

(54) METHOD FOR FABRICATING A SEMICONDUCTOR MEMORY DEVICE HAVING SILICON-ON-INSULATOR (SOI) STRUCTURE

(75) Inventor: Yun-Gi Kim, Kangwon-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/934,761

(22) Filed: Aug. 23, 2001

Related U.S. Application Data

(62) Division of application No. 09/320,214, filed on May 26, 1999, now Pat. No. 6,294,806.

(30) Foreign Application Priority Data

May 27, 1998 (KR) .............................................. 98-19164

(51) Int. Cl.⁷ ................................................ H01L 21/84
(52) U.S. Cl. ........................ 438/157; 438/283; 438/928
(58) Field of Search ................................ 438/406, 157, 438/928, 977, 283

(56) References Cited

U.S. PATENT DOCUMENTS

| | | | |
|---|---|---|---|
| 4,980,308 A | * 12/1990 | Hayashi et al. | |
| 5,376,559 A | * 12/1994 | Mukai et al. | ........ 148/DIG. 12 |
| 5,474,952 A | * 12/1995 | Fujii | ................... 148/DIG. 12 |
| 5,484,738 A | * 1/1996 | Chu et al. | ............ 148/DIG. 10 |
| 5,721,444 A | 2/1998 | Oashi et al. | ................. 257/347 |
| 5,776,789 A | * 7/1998 | Nakamura | ................... 438/155 |
| 5,952,694 A | 9/1999 | Miyawaki et al. | .......... 257/347 |
| 6,004,865 A | * 12/1999 | Horiuchi et al. | ............. 438/459 |
| 6,043,535 A | 3/2000 | Houston | ...................... 257/345 |
| 6,043,536 A | 3/2000 | Numata et al. | ............. 257/347 |
| 6,063,686 A | 5/2000 | Masuda et al. | ............. 438/406 |
| 6,100,567 A | 8/2000 | Burr | ........................... 257/347 |
| 6,110,769 A | * 8/2000 | Son | ............................. 438/164 |
| 6,111,280 A | 8/2000 | Gardner et al. | ............. 257/253 |

* cited by examiner

*Primary Examiner*—Trung Dang
(74) *Attorney, Agent, or Firm*—Lee & Sterba, P.C.

(57) ABSTRACT

A method for fabricating a SOI semiconductor device including providing a semiconductor substrate; forming a device isolation layer in and on a first surface of the semiconductor substrate to define an active region, including a source/drain region, and an inactive region; forming a first gate electrode on the first surface of the substrate; forming a first insulating layer on the first gate electrode; forming a capacitor, electrically connected to the source/drain region, on the first insulating layer; forming a second insulating layer on the capacitor; forming a third insulating layer on the second surface of the substrate; forming a body contact conductor line, electrically connected to the active region of substrate, on and through the third insulating layer; forming a fourth insulating layer on the body contact conductor line; and forming a bit line on the fourth insulating layer to be electrically connected to the source/drain region of the substrate.

40 Claims, 5 Drawing Sheets

METHOD FOR FABRICATING A SEMICONDUCTOR MEMORY DEVICE HAVING SILICON-ON-INSULATOR (SOI) STRUCTURE

This application is a divisional of application Ser. No. 09/320,214, filed May 26, 1999. now U.S. Pat. No. 6,284, 806.

FIELD OF THE INVENTION

The present invention relates to a method of making a semiconductor device, and more particularly to a semiconductor memory cell fabricated on a silicon-on-insulator (hereinafter referred to SOI) type substrate.

BACKGROUND OF THE INVENTION

Substrates useful in manufacturing semiconductor devices are increasingly required to possess a higher degree of freedom when designing a device to be fabricated thereon. Therefore, this trend has drawn more attention to the substrates of so called SOI type, which typically comprise a bonded wafer being structured such that a thermally grown oxide layer is sandwiched between two silicon wafers, at least one of the silicon wafers being monocrystalline. The bonded wafer may be used for making an electric device such as a semiconductor device or, for example, a micro machine in one of the other fields of application. A transistor built on the SOI has an advantage of requiring low supply voltage and low operation voltage due to reduced well and load resistance. In addition, the SOI transistor exhibits high operation speed.

However, the SOI transistor has some inherent drawbacks. One important shortcoming of these SOI transistors is the occurrence of the floating body effect, or electrical floating. The electrical floating of the transistor active region allows the unstable characteristics of the transistor and generates reliability concerns associated with transistor misoperation and degradation of the characteristics.

FIG. 1 schematically illustrates a DRAM device built on an SOI. The DRAM device typically includes a reversed capacitor 20 and word lines 14a and 14b, respectively formed on first insulating layer 22 and second insulating layer 18 which are disposed over a handling wafer 24 in this order. A device isolation layer 12 defines an active and an inactive region. The reversed capacitor 20 is connected to one of the source/drain regions 16 through the second insulating layer 18. The other of the source/drain regions 16 is connected to a bit line 28 at a selected portion while other areas are insulated from the other source/drain regions 16 by a third insulating layer 26 formed therebetween. An area underlying the word line 14a and between the pair of the source/drain regions 16 is defined as a channel area. A fourth insulating layer 30 is disposed over the bit line 28 and metal lines 30a and 30b are formed on the fourth insulating layer 30.

As can be seen, the channel area is in the state of electrical floating. Such a floating state of the channel area allows an irregular variation of the threshold due to an accumulation hole. Thus, there exists a need to develop a semiconductor memory device having an SOI structure that does not suffer from the drawbacks associated with electrical floating.

SUMMARY OF THE INVENTION

The present invention was made in view of the above problem, and it is therefore a feature of the present invention to provide a method for fabricating a DRAM device on an SOI type substrate wherein a channel area of the transistor is electrically connected to a conductor so as to suppress the floating body effect.

In accordance with a primary feature of the present invention, there is provided a method of fabricating a semiconductor device comprising providing a processing wafer having first and second surfaces opposing each other, forming a device isolation layer in and on the first surface of the processing wafer to define active and inactive regions, forming a gate electrode structure being composed of a gate oxide, a gate electrode and a pair of source/drain region on the active region, forming a first insulating layer on the gate electrode structure and on the first surface of the processing wafer, bonding one surface of a handling wafer onto the first insulating layer, and forming a second insulating layer on the second surface of the processing wafer. A conductor may be further formed on and in the second insulating layer so as to be electrically connected to the processing wafer underlying the gate electrode and between the pair of source/drain region. A second gate electrode may also be formed on the second insulating layer in alignment and parallel with and over the gate electrode.

In accordance with another feature of the present invention, there is provided a DRAM device on an SOI type substrate where the conductor connected to the channel area is aligned over the gate line and is parallel thereto. The conductor also is connected to the overlying metal line at the terminal portion of the cell array (i.e., around the sense amplifier). The accumulation hole caused by the floating body effect of the transistor flows out to the ground and the back-bias voltage ($V_{bb}$) through the conductor connected to the channel to thereby prevent the sub-threshold voltage leakage and suppress an unacceptable variation in the threshold voltage.

In accordance with yet another feature of the present invention, a device isolation region is formed on a semiconductor substrate or a processing wafer, and preferably the device isolation region surrounds active regions in and on one surface of the semiconductor substrate or processing wafer. A transistor including a gate oxide layer, a gate electrode, a capping layer, a pair of source/drain regions, and a channel area disposed between the pair of source/drain regions can be formed on the selected active region. A first insulating layer then may be formed on the transistor and over the semiconductor substrate or processing wafer. A capacitor then preferably is formed in a conventional manner on the first insulating layer and electrically connected to one of the source/drain region through the first insulating layer. A second insulating layer may be formed on the first insulating layer. A handling wafer then can be bonded onto the second insulating layer. The other surface of the semiconductor substrate or processing wafer preferably is ground and/or polished down to the device isolation region so that a bonded SOI type substrate is formed. A third insulating layer then can be formed on the polished semiconductor surface/processing wafer. A contact preferably is opened in the third insulating layer to the channel area of the transistor. A conductive material then can be deposited on the third insulating layer and in the contact opening and patterned to form a conductor line. A fourth insulating layer can be formed on the conductor line and over the third insulating layer. A bit line then may be formed on the fourth insulating layer and electrically connected to another source/drain region through selected fourth insulating layer. A fifth insulating layer then may be formed over the fourth insulating and a first metal line formed thereon.

According to another aspect of the present invention, the conductor line can be connected to the underlying gate line. Due to this connection between the gate line and the conductor line, the dynamic threshold voltage ($V_t$) is controlled. If the gate current is zero (i.e., off current), channel current is submitted to zero concurrently, and consequently, the sub-threshold leakage is suppressed. On the other hand, if the gate current increases to a predetermined voltage (i.e., on current), the channel voltage also increases to that magnitude, so that $V_t$ of the channel significantly decreases and increases motility.

According to another aspect of the present invention, after formation of the third insulating layer, a second gate line can be formed on the third insulating layer and parallel to the underlying embedded gate line. The two gate lines then may be connected to each other. One of the two gate electrodes serves as a backgate and operates as described above.

BRIEF DESCRIPTION OF THE DRAWINGS

The invention may be understood and its features will become apparent to those skilled in the art by reference to the accompanying drawings, wherein.

DETAILED DESCRIPTION OF THE PREFERRED EMBODIMENTS

Korean application No. 98-19164, filed May 27, 1998, is hereby incorporated by reference as if fully set forth herein.

The invention may be understood and its objects will become apparent to those skilled in the art by reference to the detailed description of the preferred embodiments, which now will be described in detail with reference to the accompanying drawings.

Figure 1:
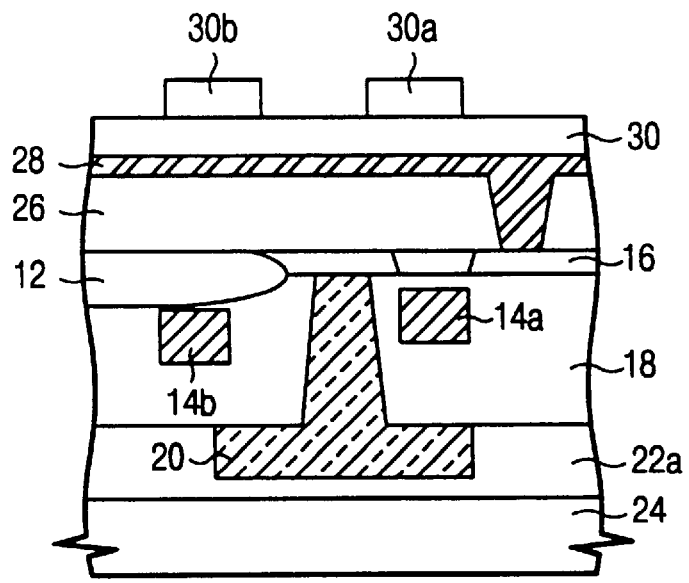
FIG. 1 is a cross-sectional view of a DRAM device fabricated on SOI type substrate according to a prior art method.
Figure 2A:
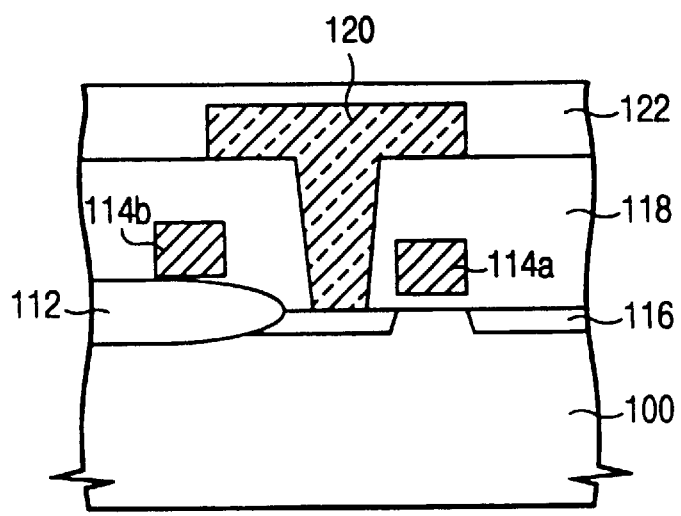
FIG. 2A is a cross-sectional view of a semiconductor substrate having a gate line and a capacitor according to a first embodiment of the present invention.

A first embodiment of the present invention will be described with reference to FIGS. 2A to 2C, 3A, 4A and 4B. FIG. 2A represents a cross-sectional view showing schematically a semiconductor substrate having already undergone certain process steps according to this embodiment of the present invention. First, a device isolation layer 112 is conventionally formed on one surface of the semiconductor substrate 100 to define an active region and inactive region. A transistor including a first and a second gate electrode 114a and 114b, a gate oxide (not shown), and source/drain regions 116 is formed on the active region of the semiconductor substrate 100. The formation of the transistor is conventional and their explanation is omitted. Accordingly, skilled artisans are capable of fabricating a transistor as shown in FIG. 2A using techniques known in the art.

A first insulating layer 118 then can be formed on the transistor and the semiconductor substrate 100 in a conventional manner known to those skilled in the art. Generally, a silicon dioxide layer is preferred as the insulating layer 118. An opening then can be formed in the first insulating layer 118 to one of the source/drain regions 116 and a lower electrode of the capacitor can be deposited in the opening and on the first insulating layer 118. A dielectric film of the capacitor and a top electrode are deposited and patterned to completely form the capacitor 120. A second insulating layer 122 such as borophosphosilicate glass (BPSG) then can be formed on the capacitor 120 and the first insulating layer 118. This second insulating layer of BPSG 122 typically is used as a glue layer for a SOI type substrate.

Figure 2B:
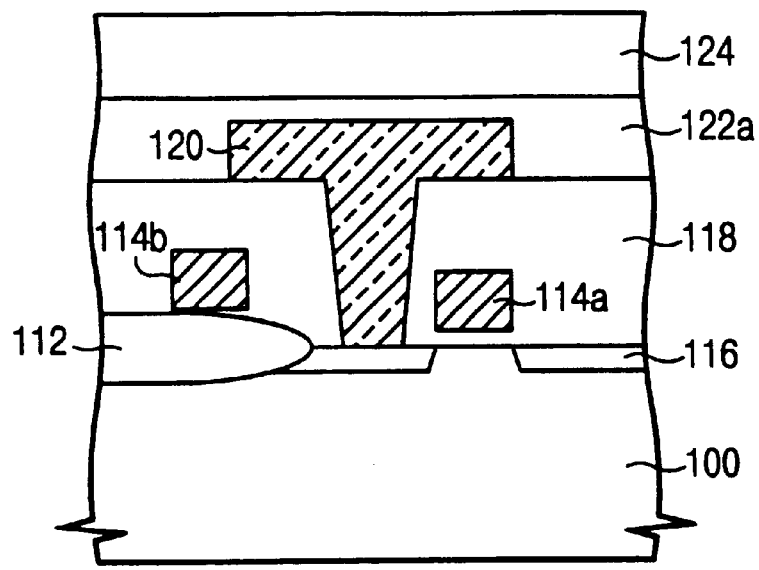
FIG. 2B illustrates a process step subsequent to that shown in FIG. 2A wherein an insulating layer is formed over the capacitor.
Figure 2C:
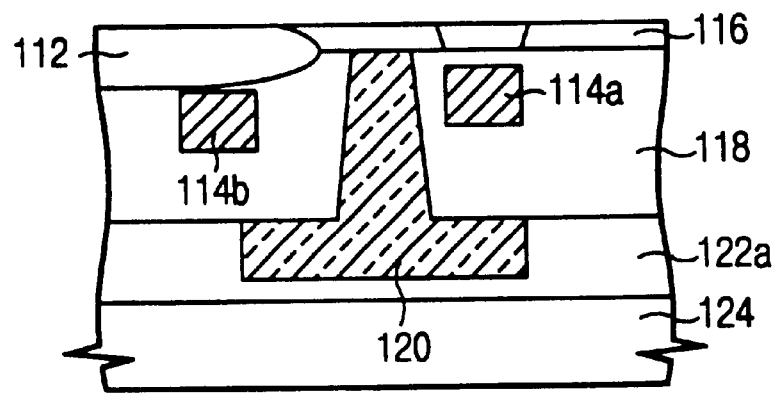
FIG. 2C illustrates a process step subsequent to that shown in FIG. 2B wherein a handling wafer is bonded onto the insulating layer to thereby form an SOI type substrate.

Referring now to FIG. 2B, the BPSG layer 122 then is grinded and polished for a SOI type substrate and subsequently bonded onto the prepared handling wafer 124. The other surface of the semiconductor substrate 100 (i.e., the surface opposing the handling wafer 124) then can be planarized down to the device isolation layer 112 as shown in FIG. 2C. The planarization process preferably is accomplished by employing a chemical mechanical polishing (CMP) technique. Those skilled in the art are capable of using the CMP technique to polish, or planarize, substrate 100 down to the device isolation layer 112.

Figure 3A:
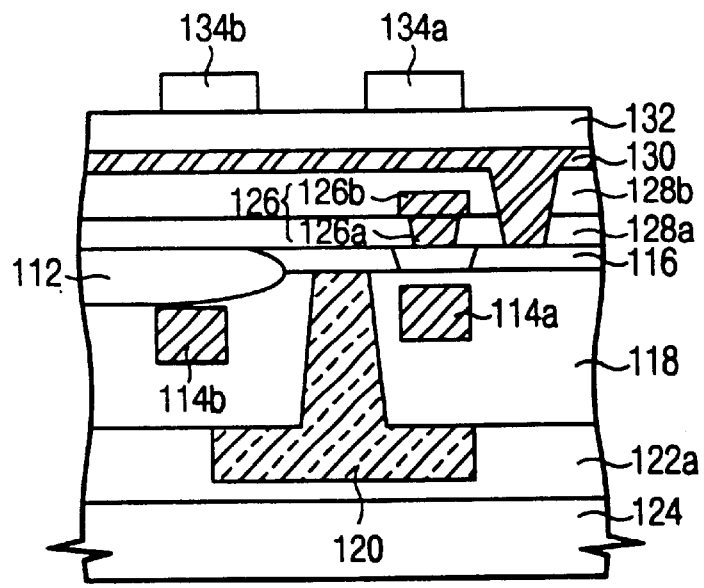
FIG. 3A illustrates a process step subsequent to that shown in FIG. 2C wherein a novel conductor line according to the invention is formed.

The formation of the body contact conductor line is described below with reference to FIG 3A. Referring now to FIG. 3A, a third insulating layer 128a, preferably composed of an oxide layer (most preferably a metal oxide layer) may be formed on the planarized surface to a thickness of about 1,000Å. An opening then can be formed in the third insulating layer 128a to the channel area corresponding tne bulk region of the semiconductor substrate between the source/drain regions 116. A conductive material preferably is deposited in the opening and on the third insulating layer 128a and patterned to form body contact conductor lines 126a and 126b, respectively. The conductive line 126b is formed overlapping and parallel to underlying gate electrode 114a. In other words, an accumulation hole that may be caused by the floating body effect is flowed to the ground or $V_{bb}$ to thereby suppress the deduction of the breakdown voltage and sub-threshold leakage. Furthermore, since the gate line and the capacitor are embedded, there is no overlapping concern between the bit line (or metal line) over the body contact conductor line and the gate line (or capacitor). Therefore, the body contact conductor line can be made of any suitable material, preferably those selected from polysilicon, tungsten silicide, tungsten, or metal, and can be used simultaneously for a resistance line of the peripheral circuit region.

The next process step is the formation of a bit line 130. In accordance with this process step, a fourth insulating layer 128b can be formed on the body contact conductor line 126b and the third insulating layer 128a. An opening then can be formed in the third and fourth insulating layers 128a and 128b, respectively, to the other one of the source/drain regions 116. A bit line material then can be deposited in the opening and on the fourth insulating layer 128b to form the bit line 130. A fifth insulating layer 132 now can be formed on the fourth insulating layer 128b and metal lines 134a and 134b formed thereon.

Figure 4A:
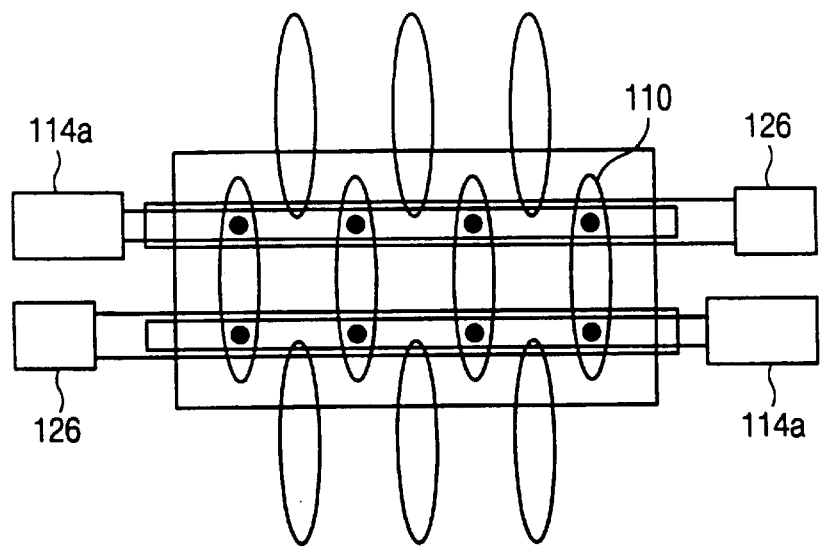
FIGS. 4A and 4B are top plan views of a SOI type substrate according to a first embodiment of the present invention and modifications thereof, respectively.

FIG. 4A illustrates schematically a top plan view of a SOI type substrate after formation of the body contact conductor line 126 (126a and 126b) according to the first embodiment. As can be seen, the body contact conductor line 126 is aligned over and parallel to the underlying the gate electrode 114a which intersects active regions 110. The body contact conductor line 126 is connected to the active regions 110 (more specifically to the channel area) through the contact plug 126a. The body contact conductor line 126 suppresses advantageously the floating body effect of the transistor.

Figure 4B:
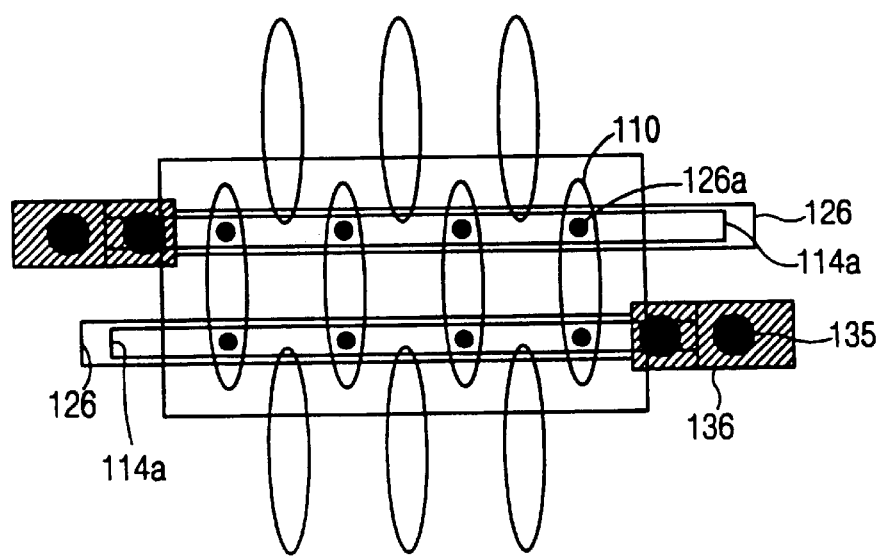

Alternatively, the gate electrode 114a and the body contact conductor line 126b may be connected to each other through a contact 135 and contact plug 136, as shown in FIG. 4B. As a result, the body contact conductor line 126b serves as a backgate.

The body contact conductor line can be connected to the ground or backbias voltage ($V_{bb}$). If the gate voltage is zero (i.e., off current), the channel area is also submitted to zero voltage thereby suppressing the sub-threshold leakage. If the predetermined voltage is applied to the gate (i.e., on current), the channel area is also applied by the same magnitude voltage of the gate thereby reducing the threshold voltage and increasing carrier concentration.

Figure 3B:
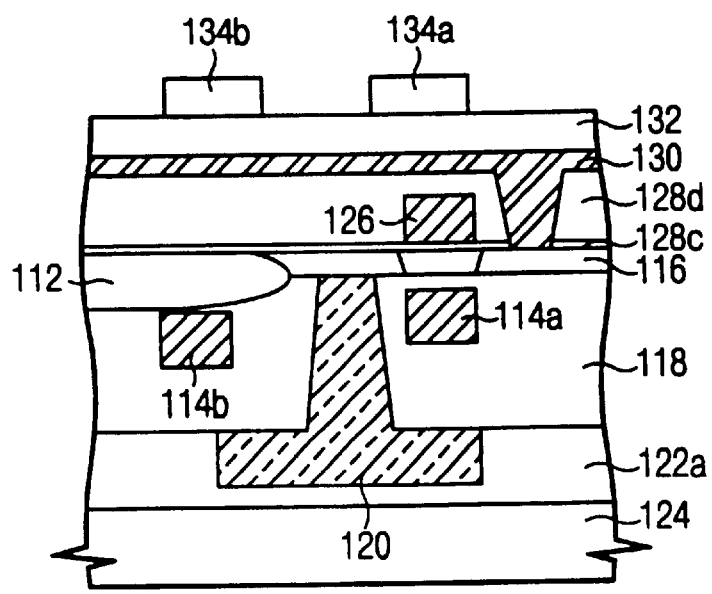
FIG. 3B illustrates a process step subsequent to that shown in FIG. 2C wherein a second gate line is formed is formed according to a second embodiment of the present invention.

A second embodiment of the present invention will be described below with reference to FIGS. 3B and FIG. 4C. The same parts functioning as the first embodiment are identified with the same reference numerals and their explanation is briefly described. After forming the SOI type substrate shown in FIG. 2C, a third insulating layer 128c can be formed on the planarized SOI surface. A second gate 126, so called backgate, then can be formed on the third insulating layer 128c so as to overlap and be parallel to the underlying first gate electrode 114a. The backgate 126 then can be connected to the first gate electrode 114a. Herein, the second gate 126 has the same resistance as the first gate electrode 114a and preferably is made of the same conductive material such as polysilicon, tungsten silicide, tungsten and metal. The process sequence of the first gate electrode and second backgate may be reversed. Briefly, after defining active and inactive region by the device isolation layer 112, a backgate may first be formed on the active region of the semiconductor substrate. Several process steps then can be carried out as described above with reference to the first embodiment. The third insulating layer 128c then can be formed and a gate subsequently formed on the third insulating layer 128c.

A fourth insulating layer 128d then can be formed on the second backgate 126 and the third insulating layer 128c. The next process sequences are similar to those described above with respect to the first embodiment. The function of the backgate is already explained in the first embodiment of the present invention.

Figure 4C:
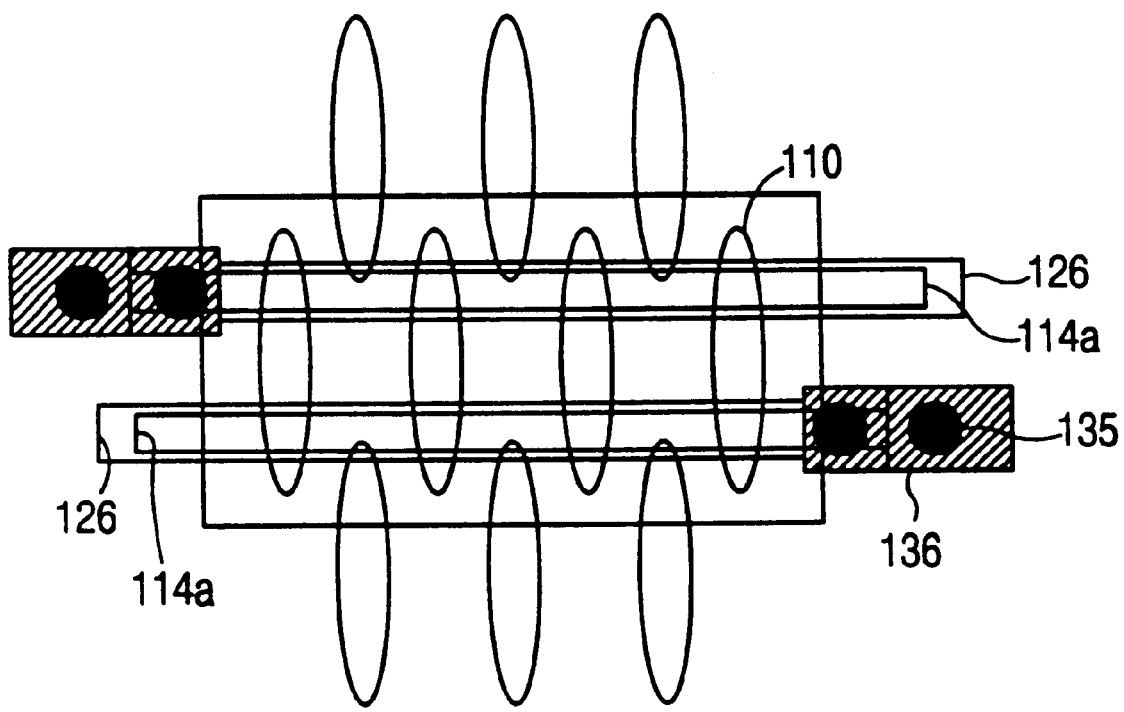
FIG. 4C is a top plan view of a SOI type substrate according to a second embodiment of the present invention.

FIG. 4C illustrates schematically a top plan view of a SOI type substrate after formation of the second backgate 126 according to the second embodiment of the present invention. As can be seen, the second backgate 126 is connected to the first gate electrode 114a through the contact 135 and contact plug 136.

It will be recognized by those skilled in the art that the innovative concepts disclosed in the present application can be applied in a wide variety of contexts. Moreover, the preferred implementation can be modified in a tremendous variety of ways. Accordingly, it should be understood that the modification and variations suggested below and above are merely illustrative. These examples may help to show some of the scope of the inventive concepts, but these examples do not exhaust the full scope of variation in the disclosed novel concepts.

What is claimed is:

1. A method for fabricating a SOI semiconductor device comprising:

providing a semiconductor substrate having first and second surfaces opposing each other;

forming a device isolation layer in and on the first surface of the semiconductor substrate to define an active region and an inactive region, wherein said active region includes at least a pair of source/drain regions;

forming a first gate electrode on the first surface of the substrate between the at least a pair of source/drain regions;

forming a first insulating layer on the first gate electrode and the first surface of the substrate;

forming a capacitor on the first insulating layer to be electrically connected to one of the at least a pair of source/drain regions;

forming a second insulating layer on the capacitor and the first insulating layer;

forming a third insulating layer on the second surface of the substrate;

forming a body contact conductor line on and through the third insulating layer in alignment with the first gate electrode to be electrically connected to the active region of substrate aligned with the first gate electrode between the at least a pair of source/drain regions;

forming a fourth insulating layer on the body contact conductor line and the third insulating layer; and forming a bit line on the fourth insulating layer to be electrically connected to one of the at least a pair of source/drain regions of the substrate.

2. The method for fabricating a SOI semiconductor device as claimed in claim 1, wherein forming the body contact conductor line further comprises:

forming a contact plug through the third insulating layer to be electrically connected to the active region of substrate aligned with the first gate electrode between the at least a pair of source/drain regions; and forming a conductive line on the third insulating layer in alignment with the contact plug, wherein the conductive line is overlapping and parallel to the first gate electrode.

3. The method for fabricating a SOI semiconductor device as claimed in claim 1 further comprising:

grinding and polishing the second insulating layer; and forming a handling wafer on the second insulating layer.

4. The method for fabricating a SOI semiconductor device as claimed in claim 2 further comprising:

grinding and polishing the second insulating layer; and forming a handling wafer on the second insulating layer.

5. The method for fabricating a SOI semiconductor device as claimed in claim 1 further comprising:

forming a fifth insulating layer on the bit line.

6. The method for fabricating a SOI semiconductor device as claimed in claim 4 further comprising:

forming at least a pair of metal lines on the fifth insulating layer.

7. The method for fabricating a SOI semiconductor device as claimed in claim 1 further comprising:

forming a second gate electrode on the first surface of the substrate in alignment with the inactive region of the substrate.

8. The method for fabricating a SOI semiconductor device as claimed in claim 1, wherein the first insulating layer is silicon dioxide.

9. The method for fabricating a SOI semiconductor device as claimed in claim 1, wherein the second insulating layer is borophosphosilicate glass (BPSG).

10. The method for fabricating a SOI semiconductor device as claimed in claim 1, wherein the third insulating layer is an oxide layer.

11. The method for fabricating a SOI semiconductor device as claimed in claim 1, wherein the third insulating layer is a metal oxide layer.

12. The method for fabricating a SOI semiconductor device as claimed in claim 1, wherein the third insulating layer is formed to a thickness of 1000 Å.

13. The method for fabricating a SOI semiconductor device as claimed in claim 1, wherein the body contact conductor line is selected from the group consisting of polysilicon, tungsten silicide, tungsten and metal.

14. A method for fabricating a SOI semiconductor device comprising:
   providing a semiconductor substrate having first and second surfaces opposing each other;
   forming a device isolation layer in and on the first surface of the semiconductor substrate to define an active region and an inactive region, wherein said active region includes at least a pair of source/drain regions;
   forming a first gate electrode on the first surface of the substrate between the at least a pair of source/drain regions;
   forming a first insulating layer on the first gate electrode and the first surface of the substrate;
   forming a capacitor on the first insulating layer to be electrically connected to one of the at least a pair of source/drain regions;
   forming a second insulating layer on the capacitor and the first insulating layer;
   forming a third insulating layer on the second surface of the substrate;
   forming a backgate on the third insulating layer in alignment with the first gate electrode to be electrically connected to the first gate electrode;
   forming a fourth insulating layer on the backgate and the third insulating layer; and
   forming a bit line on the fourth insulating layer to be electrically connected to one of the at least a pair of source/drain regions of the substrate.

15. The method for fabricating a SOI semiconductor device as claimed in claim 14 further comprising:
   grinding and polishing the second insulating layer; and
   forming a handling wafer on the second insulating layer.

16. The method for fabricating a SOI semiconductor device as claimed in claim 14 further comprising:
   forming a fifth insulating layer on the bit line.

17. The method for fabricating a SOI semiconductor device as claimed in claim 14 further comprising:
   forming at least a pair of metal lines on the fifth insulating layer.

18. The method for fabricating a SOI semiconductor device as claimed in claim 14 further comprising:
   forming a second gate electrode on the first surface of the substrate in alignment with the inactive region of the substrate.

19. The method for fabricating a SOI semiconductor device as claimed in claim 14, wherein the first insulating layer is silicon dioxide.

20. The method for fabricating a SOI semiconductor device as claimed in claim 14, wherein the second insulating layer is borophosphosilicate glass (BPSG).

21. The method for fabricating a SOI semiconductor device as claimed in claim 14, wherein the third insulating layer is an oxide layer.

22. The method for fabricating a SOI semiconductor device as claimed in claim 14, wherein the third insulating layer is a metal oxide layer.

23. The method for fabricating a SOI semiconductor device as claimed in claim 14, wherein the third insulating layer is formed to a thickness of 1000 Å.

24. The method for fabricating a SOI semiconductor device as claimed in claim 14, wherein the first gate is made of a material selected from the group consisting of polysilicon, tungsten silicide, tungsten and metal.

25. The method for fabricating a SOI semiconductor device as claimed in claim 14, wherein the backgate is made of a material selected from the group consisting of polysilicon, tungsten silicide, tungsten and metal.

26. The method for fabricating a SOI semiconductor device as claimed in claim 14, wherein the resistance of the first gate and the resistance of the backgate are the same.

27. The method for fabricating a SOI semiconductor device as claimed in claim 14, wherein the first gate and the backgate are made of the same material.

28. A method for fabricating a SOI semiconductor device comprising:
   providing a semiconductor substrate having first and second surfaces opposing each other;
   forming a device isolation layer in and on the first surface of the semiconductor substrate to define an active region and an inactive region, wherein said active region includes at least a pair of source/drain regions;
   forming a backgate on the first surface of the substrate between the at least a pair of source/drain regions;
   forming a first insulating layer on the backgate and the first surface of the substrate;
   forming a capacitor on the first insulating layer to be electrically connected to one of the at least a pair of source/drain regions;
   forming a second insulating layer on the capacitor and the first insulating layer;
   forming a third insulating layer on the second surface of the substrate;
   forming a first gate electrode on the third insulating layer in alignment with the backgate to be electrically connected to the backgate;
   forming a fourth insulating layer on the first gate electrode and the third insulating layer; and
   forming a bit line on the fourth insulating layer to be electrically connected to one of the at least a pair of source/drain regions of the substrate.

29. The method for fabricating a SOI semiconductor device as claimed in claim 28 further comprising:
   grinding and polishing the second insulating layer; and
   forming a handling wafer on the second insulating layer.

30. The method for fabricating a SOI semiconductor device as claimed in claim 28 further comprising:
   forming a fifth insulating layer on the bit line.

31. The method for fabricating a SOI semiconductor device as claimed in claim 28 further comprising:
   forming at least a pair of metal lines on the fifth insulating layer.

32. The method for fabricating a SOI semiconductor device as claimed in claim 28, wherein the first insulating layer is silicon dioxide.

33. The method for fabricating a SOI semiconductor device as claimed in claim 28, wherein the second insulating layer is borophosphosilicate glass (BPSG).

34. The method for fabricating a SOI semiconductor device as claimed in claim 28, wherein the third insulating layer is an oxide layer.

35. The method of fabricating a SOI semiconductor device as claimed in claim 28, wherein the third insulating layer is a metal oxide layer.

36. The method for fabricating a SOI semiconductor device as claimed in claim 28, wherein the third insulating layer is formed to a thickness of 1000 Å.

37. The method for fabricating a SOI semiconductor device as claimed in claim 28, wherein the first gate is made of a material selected from a group consisting of polysilicon, tungsten silicide, tungsten and metal.

38. The method of fabricating a SOI semiconductor device as claimed in claim 28, wherein the backgate is made of a material selected from a group consisting of polysilicon, tungsten silicide, tungsten and metal.

39. The method for fabricating a SOI semiconductor device as claimed in claim 28, wherein the resistance of the first gate the resistance of the backgate are the same.

40. The method for fabricating a SOI semiconductor device as claimed in claim 28, wherein the first gate and the backgate are made of the same material.

\* \* \* \* \*